Dec. 24, 1968 M. D. BLUE 3,418,473
SOLID STATE JUNCTION DEVICE FOR ULTRAVIOLET DETECTION
Filed Aug. 12, 1965

INVENTOR.
MARTS DONALD BLUE
BY Robert O. Vidas
ATTORNEY 3,418,473
Patented Dec. 24, 1968

3,418,473

SOLID STATE JUNCTION DEVICE FOR ULTRAVIOLET DETECTION

Marts D. Blue, Edina, Minn., assignor to Honeywell Inc., Minneapolis, Minn., a corporation of Minnesota Filed Aug. 12, 1965, Ser. No. 479,090
5 Claims. (Cl. 250—83.3)

ABSTRACT OF THE DISCLOSURE

A light sensitive semiconductor device which has a retrograded P-N junction parallel to the surface; the retrograded junction serving to amplify the number of carriers created by impingement of photons.

The present invention is directed to a light sensitive silicon semiconductor device which utilizes a retrograded junction as a means of amplifying the number of carriers created by the impingement of a photon of ultraviolet light on a P-N junction in a semiconductor body.

More particularly, the present invention is directed to a solid state sensor for ultraviolet radiation wherein the sensitivity to ultraviolet radiation is markedly increased by the use of a retrograded junction.

The light sensitive characteristic of semiconductor materials, and in particular the sensitivity of P-N junctions to light have been known for many years. Considerable use has been made of the light sensitivity in the field of solar energy generation. In devices of this type the impingement of light on a body of semiconductive material containing a junction results in the generation of electron-hole pairs. This gives rise to a photovoltaic current that can be utilized. In another light sensitive device of the prior art the P-N junction is reversed biased and any light, of wavelength such as to create electron-hole pairs, which strikes the junction results in an output across the junction due to the lowering of the impedance. Little or no amplification of the number of electron-hole pairs occurs, so consequently, the sensitivity of such devices is not of a high order.

The present invention through the use of a retrograded junction, which is located very close to the surface of the semiconductive body and parallel thereto, provides a very high amplification of the number of carriers. By means of this amplification a highly light sensitive device is produced.

The invention will be described with some particularity with regard to FIGURES 1 through 3 wherein.

The principle of the present invention may be utilized in a variety of different forms depending on the need of the user. The invention will be described with regard to the use of silicon as the semiconductive material and in detail with regard to the use of an N-type silicon material of high quality having a resistivity of about 300 ohm cm. This material should have a very low dislocation density and would have an impurity concentration on the order of $10^{13}$ atoms/cc. Alternatively, one can start with a body of P-type silicon of similar high quality wherein the resistivity would be approximately 1000 ohm cm. material. These figures are merely illustrative and it is not intended to be restricted to these precise values. For ease of understanding the balance of the example will be limited to the use of an N-type starting material, although it should be kept in mind that one may reverse the conductivity type materials.

Figure 1:
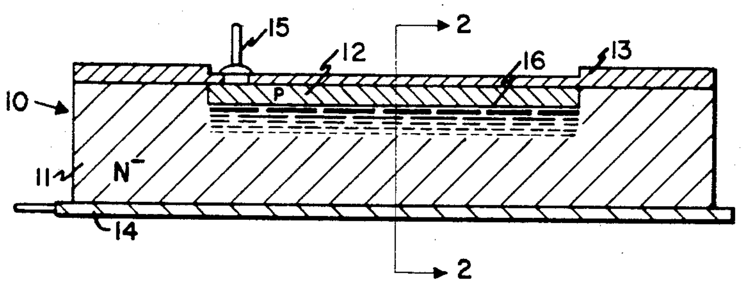
FIGURE 1 is a cross sectional view of a sensor in accordance with the present invention.

Turning now to the drawings 10 generally indicates a device in accordance with the invention wherein a body of high quality N-type material 11 is illustrated in FIGURE 1. Into one of the major surfaces of the body there has been diffused a region of P-type semiconductor material 12. Such diffusion is a well known technique in the art and utilizes a layer of silicon monoxide or silicon dioxide as a mask. In the drawing the silicon dioxide is indicated generally as 13. The raised portions of silicon dioxide indicate the thickness of the original material utilized as a mask for the preparation of the diffusion. An opening had been previously etched through this layer coextensive with region 12 of P-type semiconductor material. Subsequent to the diffusion resulting in P-type region 12 an additional silicon dioxide film has been produced in the opening which is shown in the drawing as being the thinner portion of 13. Electrodes 14 and 15 are attached to the regions 11 and 12 respectively. The electrode 15 is attached to region 12 through a hole produed in the oxide 13.

Figure 2:
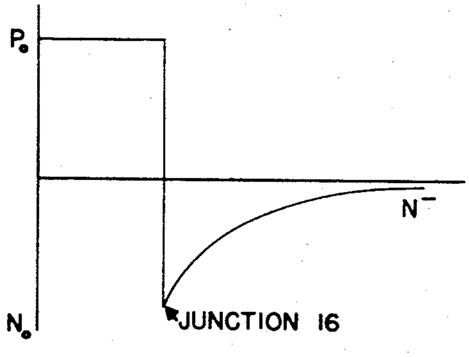
FIGURE 2 is a profile along line 2—2 of FIGURE 1 of the impurity concentration of N and P-type dopants.

A P-N junction 16 results between region 12 and the N-type material 11. However, the P-N junction does not occur with the original high purity material 11, but occurs with a diffused portion of 11 containing additional N-type impurities. These impurities are introduced in such a manner as to provide a profile in accordance with that illustrated in FIGURE 2. The figure shows the excess of acceptor or P-type impurities, or alternatively, the excess of donor or N-type impurities in each region. The regions adjacent the junction 16 are such as to produce a retrograded junction toward the side of the original semiconductive material 11. Various techniques may be utilized for producing such retrograded junctions. A variety of techniques have been described in the literature. One such technique which is readily adaptable is that of sequential diffusion. In this technique both N and P-type impurities are diffused into the original body 11 through an opening in a mask such as 13. The N-type impurity is selected to be one which can be readily diffused to some distance into the body. For example, one may use phosphorous as the N-type impurity and diffuse it into the body to a depth of about 10 microns. Subsequent to the diffusion of the N-type impurity, a P-type impurity such as boron is diffused very shallowly to a depth of 1 micron or less into the same surface so as to provide an impurity concentration of $10^{19}$ to $10^{20}$ atoms/cc. This high concentration of boron now dominates the previous diffusion of phosphorous into the same region. At the point of junction between the P-type and N-type impurities the concentration of the N-type impurity should be approximately $10^{16}$ atoms/cc. A very high concentration of impurity on the P-type side is desirable to minimize the resistance in the P-type region. A device made in this manner is useful for what will be described as a high voltage device. Alternatively, one may diffuse the N-type impurity in such a manner as to have a concentration of N-type material at the junction of about $10^{18}$ atoms/cc. In this case, the diffusion depth would extend less than 1 micron beyond the junction. Such a device would be useful for what will be described as a low voltage system. It would be recognized that the N-type impurity will go from this high value at the junction diminishing in concentration to the concentration of the original starting material 10.

Another technique which may be utilized is that of simultaneous diffusion of the N and P-type materials into the original body of semiconductor material. In this instance one will select appropriate sources and temperatures to accomplish a retrograded junction. Such techniques are known in the art.

Yet another technique which can be readily utilized is that of diffusing the N-type impurity into the original semiconductor body 11 following which an epitaxial layer of P-type semiconductor material is grown onto the original body.

Figure 3:
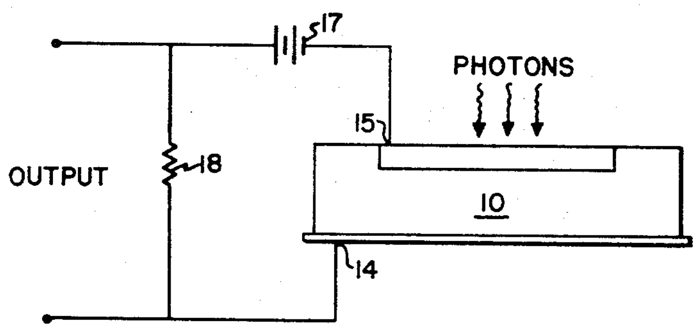
FIGURE 3 is an illustration of a simple circuit for utilizing the device in accordance with the present invention.

Turning now to FIGURE 3 there is illustrated a simple circuit utilizing a device in accordance with the present invention for detecting ultraviolet radiation. In the drawing, a sensor in accordance with FIGURE 1 is connected through leads 14 and 15 to a voltage source 17 and a high value resistor 18. The sensor is connected to the voltage source so as to be back biased. Until photons of ultraviolet energy penetrate the surface of the sensor creating hole electron pairs at the junction essentially no current will flow. When such photons create hole electron pairs, the carriers are multiplied due to the presence of the retrograded junction dependent upon the voltage impressed across the junction.

Previously, reference had been made to the high and low voltage devices. In the high voltage device described a voltage source of 300 to 400 volts is impressed across the sensor. This will result in a gain of approximately 1000 fold in the number of carriers over that that would be found in a device of the prior utilizing the ordinary junction rather than the retrograded junction of the invention.

In the instance where a lower voltage device is desired, one would use a sensor made in accordance with the description given above for such a low voltage sensor. By utilizing the lower applied voltage one sacrifices some of the possible gain in carriers associated with the use of the retrograded junction.

Having described my invention I claim:

1. An ultraviolet photodetector comprising:

(a) a body of high purity silicon of a first conductivity type having a major surface, (b) a first diffused region of said first conductivity type in said body, (c) a second region of the opposite impurity type defining a P-N junction with said first region, the major part of said junction being substantially parallel to said surface and closely adjacent there to, the junction characterized in having diminishing concentration of said first impurity type away from said junction, (d) means for exposing said regions to a source of ultraviolet radiation, (e) circuit means connected across said junction including voltage biasing means and means for responding to the change in resistance across said junction.

2. A device in accordance with claim 1 wherein said second region extends into said body less than about 1 micron and said first region extends into said body from about 1 to about 10 microns beyond said second region.

3. A device in accordance with claim 1 wherein said first region is of N-type conductivity and said second region is of P-type.

4. A device in accordance with claim 2 wherein the dominant impurity concentration in said second region is greater than about $10^{19}$ atoms/cc. and the dominant impurity concentration in said first region is about $10^{18}$ atoms/cc. at the P-N junction.

5. A device in accordance with claim 4 wherein the impurity in said first region is phosphorous and the impurity in said second region is boron.

References Cited

UNITED STATES PATENTS

| | | | |
|---|---|---|---|
| 2,899,343 | 8/1959 | Statz | 317—235 X |
| 2,986,591 | 5/1961 | Swanson et al. | 250—211 X |
| 3,054,033 | 9/1962 | Iwama et al. | 317—235 X |
| 3,260,624 | 7/1966 | Wiesner | 317—235 X |

WALTER STOLWEIN, *Primary Examiner.*

U.S. Cl. X.R.

250—211; 317—235